US006687379B1

(12) United States Patent
Thiel

(10) Patent No.: US 6,687,379 B1
(45) Date of Patent: Feb. 3, 2004

(54) SYSTEM AND METHOD FOR ADJUSTING THE LOW-FREQUENCY RESPONSE OF A CROSSOVER THAT SUPPLIES SIGNAL TO SUBWOOFERS IN RESPONSE TO MAIN-SPEAKER LOW-FREQUENCY CHARACTERISTICS

(75) Inventor: James Thiel, Lexington, KY (US)

(73) Assignee: Thiel Audio Products, Lexington, KY (US)

( * ) Notice: Subject to any disclaimer, the term of this patent is extended or adjusted under 35 U.S.C. 154(b) by 253 days.

(21) Appl. No.: 09/849,633

(22) Filed: May 4, 2001

Related U.S. Application Data

(60) Provisional application No. 60/207,790, filed on May 30, 2001.

(51) Int. Cl.[7] .................................................. H03G 5/00

(52) U.S. Cl. ............................................ 381/99; 381/98

(58) Field of Search ............................ 381/99, 98, 100, 381/77, 80, 103

(56) References Cited

U.S. PATENT DOCUMENTS

| | | | | |
|---|---|---|---|---|
| 5,617,480 A | * | 4/1997 | Ballard et al. | 381/98 |
| 5,930,374 A | * | 7/1999 | Werrbach | 381/99 |
| 6,317,117 B1 | * | 11/2001 | Goff | 381/104 |

* cited by examiner

*Primary Examiner*—Minsun Oh Harvey
(74) *Attorney, Agent, or Firm*—Thomas, Kayden, Horstemeyer & Risley

(57) ABSTRACT

A system and method for adjusting a subwoofer sonic output in response to known main speaker characteristics in order to produce a desirable blending of sound from the combined subwoofer-main speaker output.

19 Claims, 14 Drawing Sheets

SYSTEM AND METHOD FOR ADJUSTING THE LOW-FREQUENCY RESPONSE OF A CROSSOVER THAT SUPPLIES SIGNAL TO SUBWOOFERS IN RESPONSE TO MAIN-SPEAKER LOW-FREQUENCY CHARACTERISTICS

CROSS REFERENCE TO RELATED APPLICATIONS

This application claims the benefit of U.S. Provisional Patent Application No. 60/207,790, filed May 30, 2001, which is incorporated herein by reference in its entirety

FIELD OF INVENTION

This invention relates generally to loudspeakers, and more particularly to a crossover or a frequency response shaping system for adjusting the frequency response of a subwoofer that, in conjunction with a main speaker, produces the sonic output.

BACKGROUND

As is well known, a loudspeaker receives an electrical signal representing an audio sound, and converts the electrical signal to an audio sound wave via a loudspeaker driver unit. The driver unit comprises, in part, a motor that responds to the electrical signal to move a diaphragm. The movement of the diaphragm perturbs the surrounding air, which causes the audio wave.

Due to inadequate low-frequency characteristics, many loudspeakers do not respond well to input signals of very low frequencies (i.e., the bass or lower register). Thus, a high quality audio system may include a separate, specialized speaker, termed a subwoofer, which is designed to more accurately reproduce the lower frequencies of the full sound spectrum. This subwoofer may be used to reproduce the low-frequency portion of the same signal that is provided to the main speakers. In these applications, it is usually desirable to restrict the frequency range reproduced by the subwoofer to a range that is not reproduced by the main speakers. Further, it is desirable that the frequency and phase response characteristics of the subwoofer be adjustable so that the outputs of the subwoofer and the main speaker will combine in a desirable way (e.g., to produce a uniform frequency response). Thus, the response characteristics of the subwoofer is intended to complement the response characteristics of the main speaker, hence, achieving a desirable blending of the sonic output (i.e., sound) of the main speaker and the subwoofer. Unfortunately, subwoofer controls normally lack the capacity to properly adjust the output to achieve a subwoofer response that will complement the main speaker response.

In light of these problems, there is a need in the art for a subwoofer response determining system (commonly referred to as a crossover) that produces a proper blending of the subwoofer sonic output and the main speaker sonic output.

SUMMARY

The present invention provides a system and method for accurately reproducing audio sounds by adjusting the response characteristics of a subwoofer to produce a proper blending of sound from a subwoofer and a main speaker in a sound reproduction system.

In architecture, the system comprises a compensation circuit configured to produce a desired low-frequency signal from an input signal in response to user adjustable settings that are indicative of main speaker response characteristics. The desired low-frequency signal, when cascaded through the subwoofer amplifier and the subwoofer, produces a subwoofer sonic output that, when combined with the main speaker sonic output, produces a more desirable blending of high-frequency and low-frequency sounds (i.e., a higher quality sound).

In accordance with another aspect of the present invention, a method is provided for accurately producing audio sounds by adjusting the low-frequency sonic output of a subwoofer. In the method, a desired low-frequency signal is produced in response to user adjustable settings that are indicative of main speaker characteristics. The desired low-frequency signal is produced by subtracting a signal indicative of the main speaker response from a signal indicative of the desired combined subwoofer-main speaker response.

Other systems, methods, features, and advantages of the invention will be or become apparent to one with skill in the art upon examination of the following figures and detailed description. It is intended that all such additional systems, methods, features, and advantages be included within the scope of the invention, and be protected by the accompanying claims.

BRIEF DESCRIPTION OF THE DRAWINGS

The above and further features, advantages, and benefits of the present invention will be apparent upon consideration of the following detailed description, taken in conjunction with the accompanying drawings, in which like reference characters refer to like parts throughout.

DETAILED DESCRIPTION OF DRAWINGS

Figure 1:
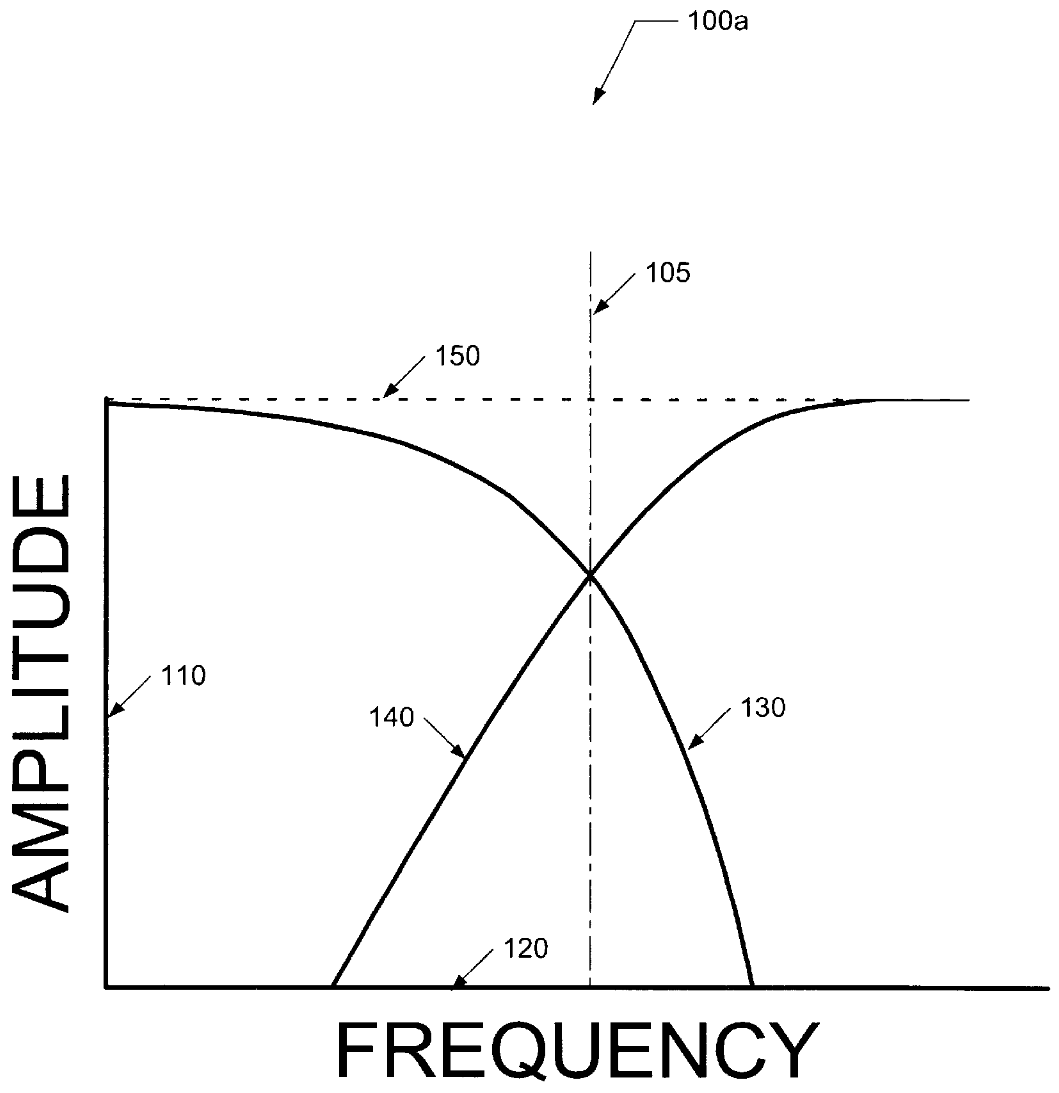
FIG. 1 is a frequency response plot showing a combined subwoofer-main speaker frequency response.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

Theory

The normal audible sound spectrum consists of a frequency range from approximately 20 Hz up to approximately 20 kHz. Since speakers in a typical stereo system do not have a uniform frequency response to the lowest parts of the audible sound range, the low-frequency components of the sound range may be reproduced by different speakers having a superior low-frequency response. An example of this is given in FIG. 1, which is a frequency response plot showing the high-frequency and low-frequency components of a signal. Ideally, a crossover alters a uniform input signal 150 into a low-frequency signal 130 having frequencies below the given frequency 105. The input signal 150 is amplified through a main speaker amplifier while the low-frequency signal 130 is amplified through a subwoofer amplifier. The signal from the main speaker amplifier is then channeled through a main speaker which provides the high-frequency signal 140, determined by its low-frequency characteristics. Similarly, the signal from the subwoofer amplifier is channeled through a subwoofer which provides the low frequency sounds.

Since the combined output 150 of the subwoofer and the main speaker is the sum of the high-frequency component 140 and the low-frequency component 130, if a desired combined output 150 is known and the actual high-frequency output 140 of the main speaker is also known, then an appropriate low-frequency signal 130 having the desired low-frequency characteristics may be produced by subtracting the high-frequency output 140 from the desired combined output 150.

The present invention provides such a system and method for producing such a desired low-frequency signal from a crossover. The details of the invention, discussed below, are not to be taken in a limiting sense but are made merely for the purpose of describing the general principles of the invention. The scope of the invention should be ascertained with reference to the issued claims.

Crossover for Producing a Desired Low-Frequency Signal

Figure 2:
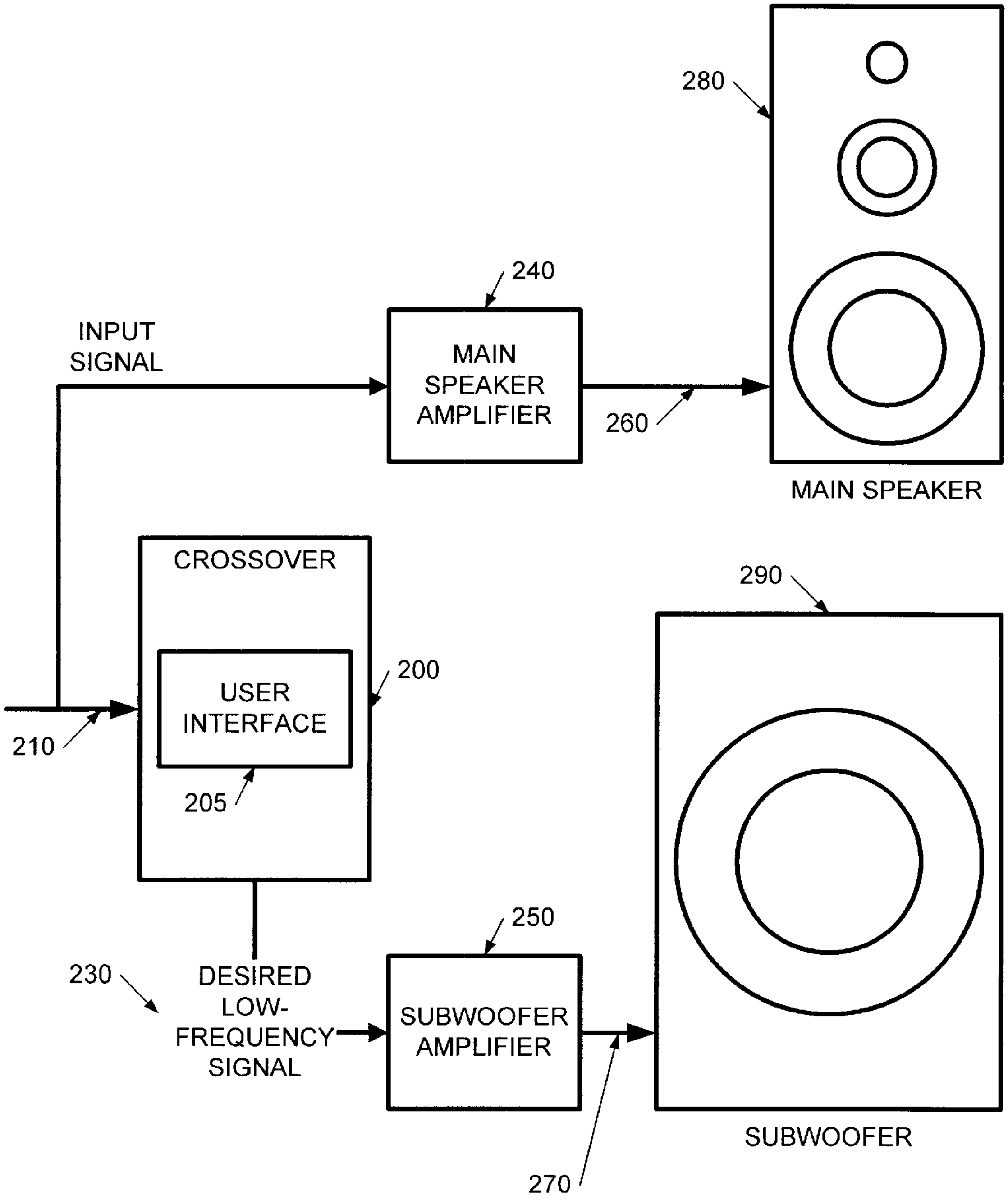
FIG. 2 is a simplified block diagram showing a crossover in relation to components of a typical audio system.

Turning now to the system of the invention, FIG. 2 shows a high-level diagram of a sound system utilizing the present invention. The sound system includes the crossover 200 designed to incorporate information about the frequency response of a main speaker 280 (i.e., to implement the compensation technique discussed above). The crossover 200 comprises a user interface 205 that allows a user to input various parameters related to the main speaker 280. These parameters reflect the degree of adjustment needed to compensate for actual frequency response characteristics of the main speaker 280 as described in FIG. 1. The crossover 200 receives an input signal 210 and produces the desired low-frequency signal 230. The input signal 210 is also sent to a main speaker amplifier 240, which amplifies the input signal 220 to produce an amplified input signal 260. The amplified input signal 260 is then sent to a main speaker 280 for the production of sound. The desired low-frequency signal 230 is cascaded through a subwoofer amplifier 250 configured to amplify the desired low-frequency signal 230, and the resulting amplified low-frequency signal 270 is then sent to a subwoofer 290 configured to produce the low-frequency sounds. The desired low-frequency signal 230 produced by the crossover 200 takes into account the low-frequency range that is produced by the main speaker 280. Hence, the blending of the subwoofer's sonic output with the main speaker's sonic output produces the desired combined sonic output.

Although the crossover 200 is shown as a separate component, it may be integrated with other components of the speaker system. For example, the crossover 200 and subwoofer amplifier 250 may be integrated into a single unit or, alternatively, the crossover 200 and main-speaker amplifier 240 may be integrated into a single unit. Moreover, although the current embodiment only shows a low-frequency output, it will be clear to one of ordinary skill in the art that a high-frequency component may also be produced by the crossover. It will also be clear to one of ordinary skill in the art that the inventive nature does not depend on the possible permutations by which the crossover may be combined with other sound system components.

Figure 3:
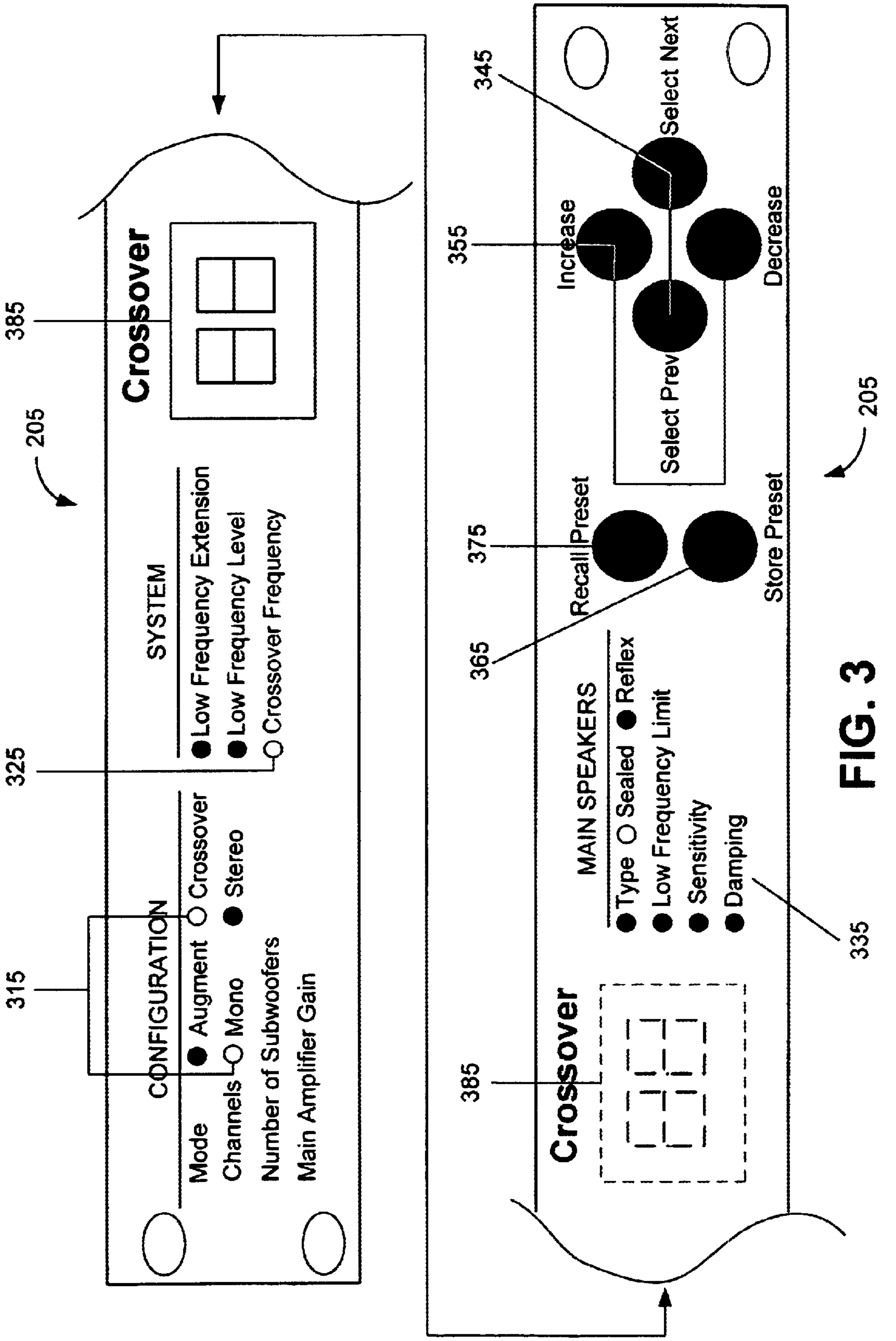
FIG. 3 is a diagram of a front panel of the preferred crossover, configured to receive user adjustable settings.

FIG. 3 shows a front panel, or user interface 205, of a crossover 200 (FIG. 2) in the sound system of FIG. 2. The user interface 205 allows the user to control many parameters associated with the sound reproduction system such as configuration parameters 315, system parameters 325, or main speaker characteristics 335. The configuration parameters 315 typically include mode (e.g., augment or crossover), channel (e.g., stereo or mono), number of subwoofers, and main amplifier gain. System parameters 325 may include low frequency extension, low frequency level, and crossover frequency. Main speaker characteristics 335 may include type (e.g., sealed or reflex), low frequency limit, sensitivity, and damping factor. These parameters are adjusted using selection buttons 345 configured to select the parameter to be adjusted, and adjust buttons 355 configured to adjust those selected features. A display 385 on the user interface 205 apprises the user of the changing parameters. Once the system parameters are set using the selection buttons 345 and the adjust buttons 355, the user may store the parameters using a store button 365. Alternatively, once certain parameters have been stored, the user may recall the stored parameters using a recall button 375.

Although several parameters and options are shown in the example user interface 205, it will be clear to one of ordinary skill in the art that the user interface 205 may be more or less complex depending on the options available for such a system. For purposes of this discussion, the parameters of interest are configuration mode (specifically, augment mode) and the main speaker characteristics 335. Upon selection of augment mode (configuration parameter 315), the user may enter main speaker characteristics 335 (e.g., type, low frequency limit, sensitivity, damping factor, etc.) related to known characteristics of the main speaker 280 (FIG. 2). Responsive to the user's input of the main speaker characteristics 335, the crossover 200 adjusts the low-frequency response of the crossover 200 (FIG. 2) in response to these main speaker characteristics so that the crossover 200 (FIG. 2) produces a desired low-frequency component 230 (FIG. 2) of the signal. The desired low-frequency component 230

(FIG. 2), when cascaded through the subwoofer amplifier 250 (FIG. 2) and the subwoofer 290 (FIG. 2), produces a response that, when combined with the main speaker response, produces an ideal combined response (i.e., a desirable blending of sound). Although the front panel (or user interface) is shown in the present embodiment as having configuration parameters, system parameters, and main speaker characteristics, it will be clear to one of ordinary skill in the art that additional user options may be implemented through the user interface. These user options may include, but are not limited to, acoustics of the room, temperature, number of speakers, etc. Similarly, it will be clear to one of ordinary skill in the art that several options may be removed from the user interface in order to reduce the complexity of the system for the user. Although only certain options are shown in the user interface, it is not intended to limit the invention to only those options. On the contrary, the intent is to cover all alternatives, modifications, and equivalents included within the spirit and scope of the invention as defined by the appended claims.

Figure 4A:
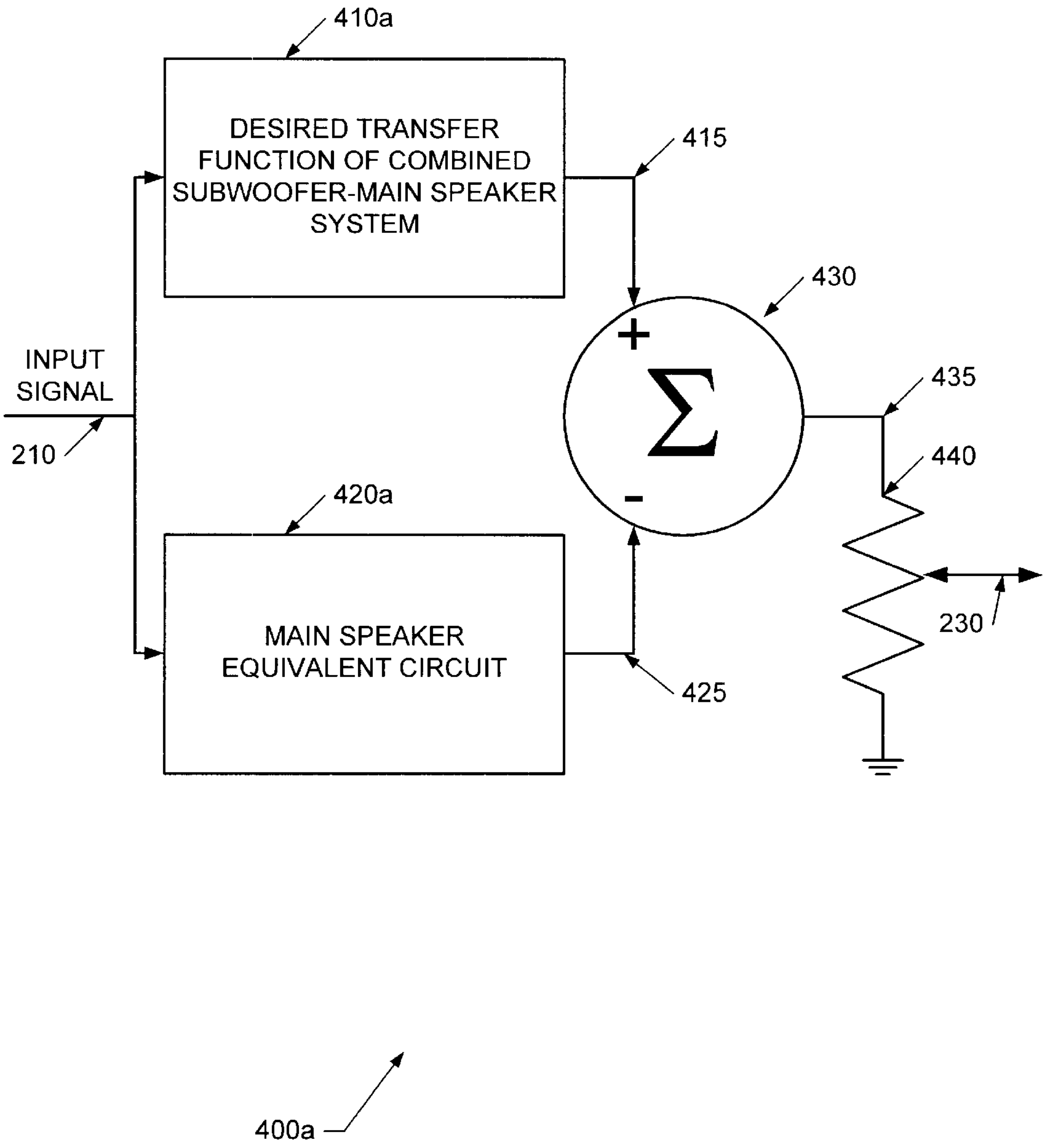
FIG. 4A is a block diagram showing a simplified architecture of a compensation circuit having a desired transfer function circuit, a main-speaker equivalent circuit, and a summing circuit.

Turning now to the details of a system for generating the desired low-frequency signal in response to the user inputs indicative of main-speaker low-frequency characteristics, FIG. 4A shows an embodiment of the invention as a compensation circuit 400*a* configured to produce the desired low-frequency signal 230 (FIG. 2). In this embodiment, an input signal 210 is passed through a desired transfer function circuit 410*a*, which produces a desired system signal 415 having the characteristics of a desired combined subwoofer-main speaker signal 150 (FIG. 1). The desired system signal 415 is then transmitted to a summing circuit 430.

The input signal 210 is also passed through a main-speaker equivalent circuit 420*a*, which produces a main-speaker equivalent signal 425 having the low-frequency characteristics of a signal produced by a main speaker (e.g., 140 of FIG. 1). This main-speaker equivalent signal 425 is also transmitted to the summing circuit 430. The summing circuit 430 receives both the desired system signal 415 and the main-speaker equivalent signal 425, and subtracts the main-speaker equivalent signal 425 from the desired system signal 415 to produce a subtracted signal 430. The amplitude of the subtracted signal 430 is adjusted by a gain adjusting circuit 440, which is typically a variable resistor, to produce a desired low-frequency signal 230. As seen from FIG. 4A, rather than directly setting the characteristics for the low-frequency signal (e.g., directly setting a high-frequency roll-off or directly setting low-pass characteristics) as is done in typical subwoofer systems, this invention generates the desired low-frequency signal 230 from known characteristics of the main speaker so as to better compensate for main-speaker low-frequency characteristics and, therefore, producing a better blend of sound from the main speaker and the subwoofer.

The compensation circuit 400*a* of this invention can be best demonstrated by using a specific example. FIGS. 4B, 5A, 5B, 5C, 6A, 6B, 6C, and 6D provide the specific example illustrating the construction and operation of the compensation circuit 400*a* illustrated in FIG. 4A. This example is not provided to limit the invention to the specific details but, rather, to more clearly illustrate the operation of certain aspects of the invention.

Figure 4B:
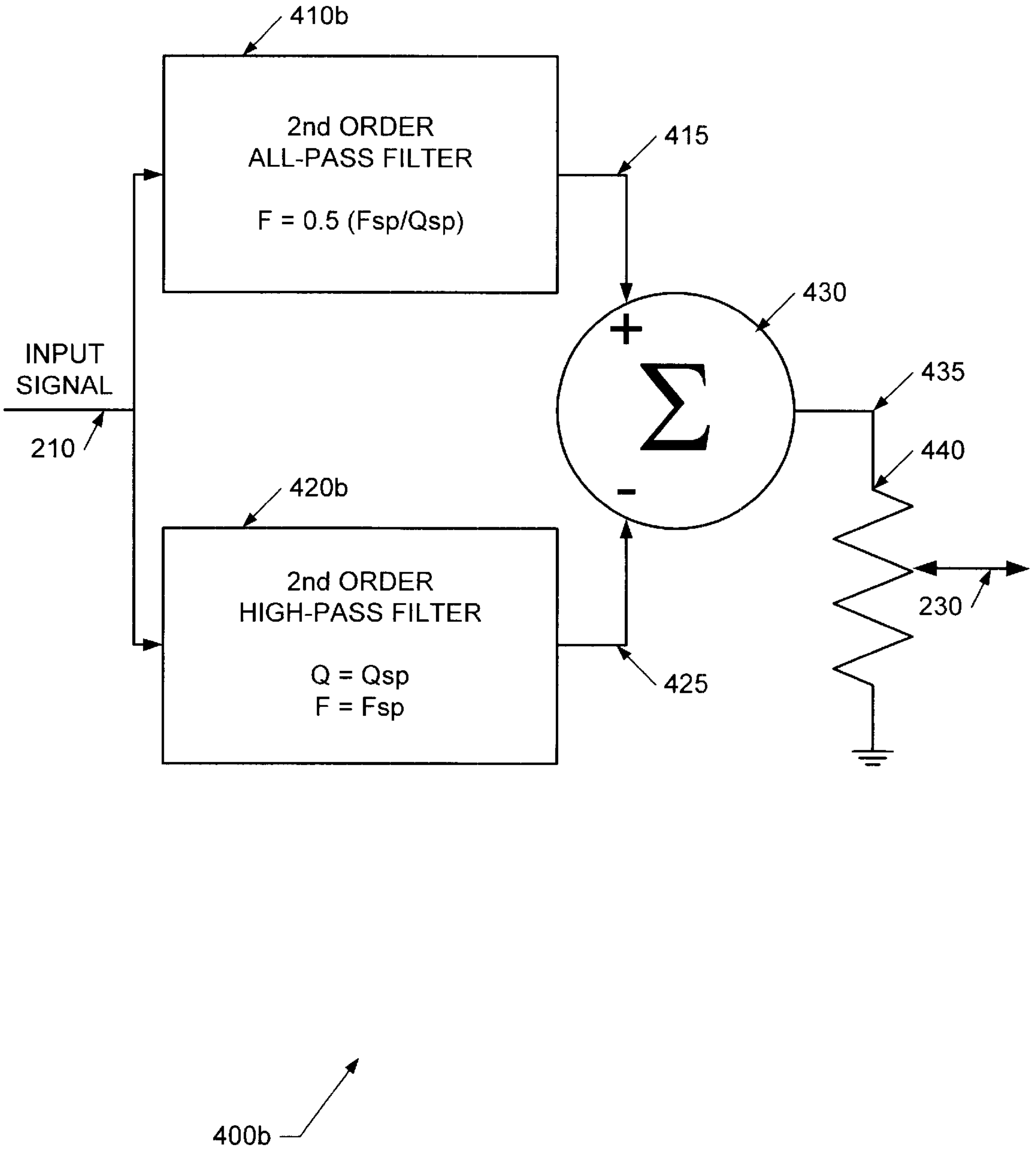
FIG. 4B is a block diagram showing an example system of FIG. 4A having an all-pass filter as a desired transfer function circuit and a $2^{nd}$-order high-pass filter as an analog of the main speaker high-pass function.

FIG. 4B is a specific example of the compensation circuit 400*a* of FIG. 4A. In this example, the main speaker response is represented as a $2^{nd}$-order high-pass filter 420*b* having a cutoff frequency of $F_{sp}$ and a damping factor of $Q_{sp}$. In a preferred embodiment, a desired combined subwoofer-main speaker response 150 (FIG. 1) would be represented by a $2^{nd}$-order all-pass filter having a characteristic frequency, $F_{ap}$, of:

$$F_{ap} = \frac{F_{sp}}{2Q_{sp}} \qquad \text{[Eq. 1]}$$

Once the cutoff frequencies and damping factors of the main speaker response and the desired combined response are known, these factors are used to create the compensation circuit 400*a* (FIG. 4A) configured to produce the desired low-frequency signal 230 in response to the main-speaker low-frequency characteristics.

Figure 5A:
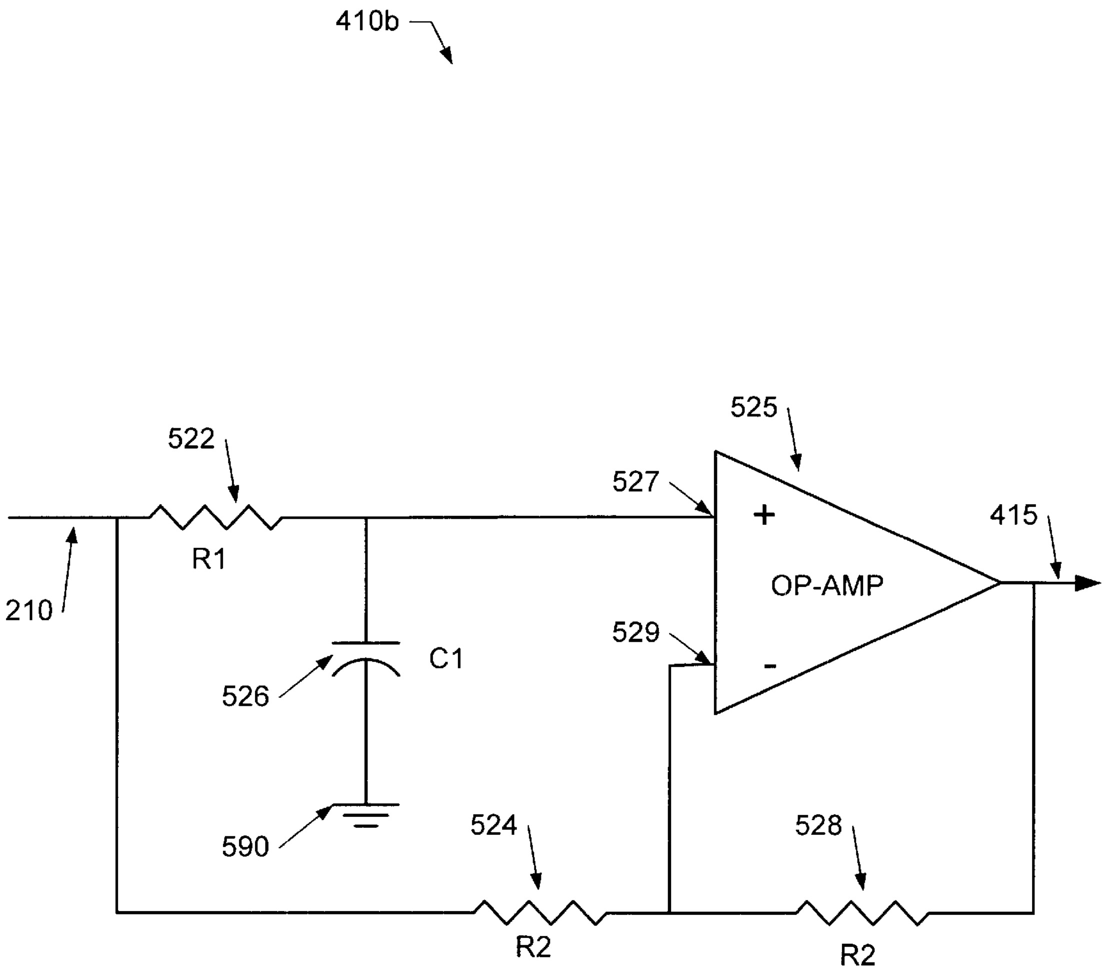
FIG. 5A is a circuit diagram showing the all-pass filter of FIG. 4B in more detail.

Continuing with this example, FIG. 5A shows a $2^{nd}$-order all-pass filter 410*b* that may be used to produce the desired all-pass response of FIG. 4B. The all-pass filter 410*b* comprises an operational amplifier 525, a variable resistor 522 with a resistance of $R_1$, a capacitor with a capacitance of $C_1$, and two fixed resistors 524, 528 with a resistance of $R_2$, configured to achieve the desired $2^{nd}$-order all-pass characteristics. The characteristic frequency of the all pass filter is given by Eq. 2 as:

$$F_{ap} = \frac{1}{2\pi C_1 R_1} \qquad \text{[Eq. 2].}$$

And, since in this example it is desired that the all-pass frequency be set according to Eq. 1, the variable resistance, $R_1$, may be represented as:

$$R_1 = \frac{Q_{sp}}{C_1 \pi F_{sp}} \qquad \text{[Eq. 3].}$$

Figure 5B:
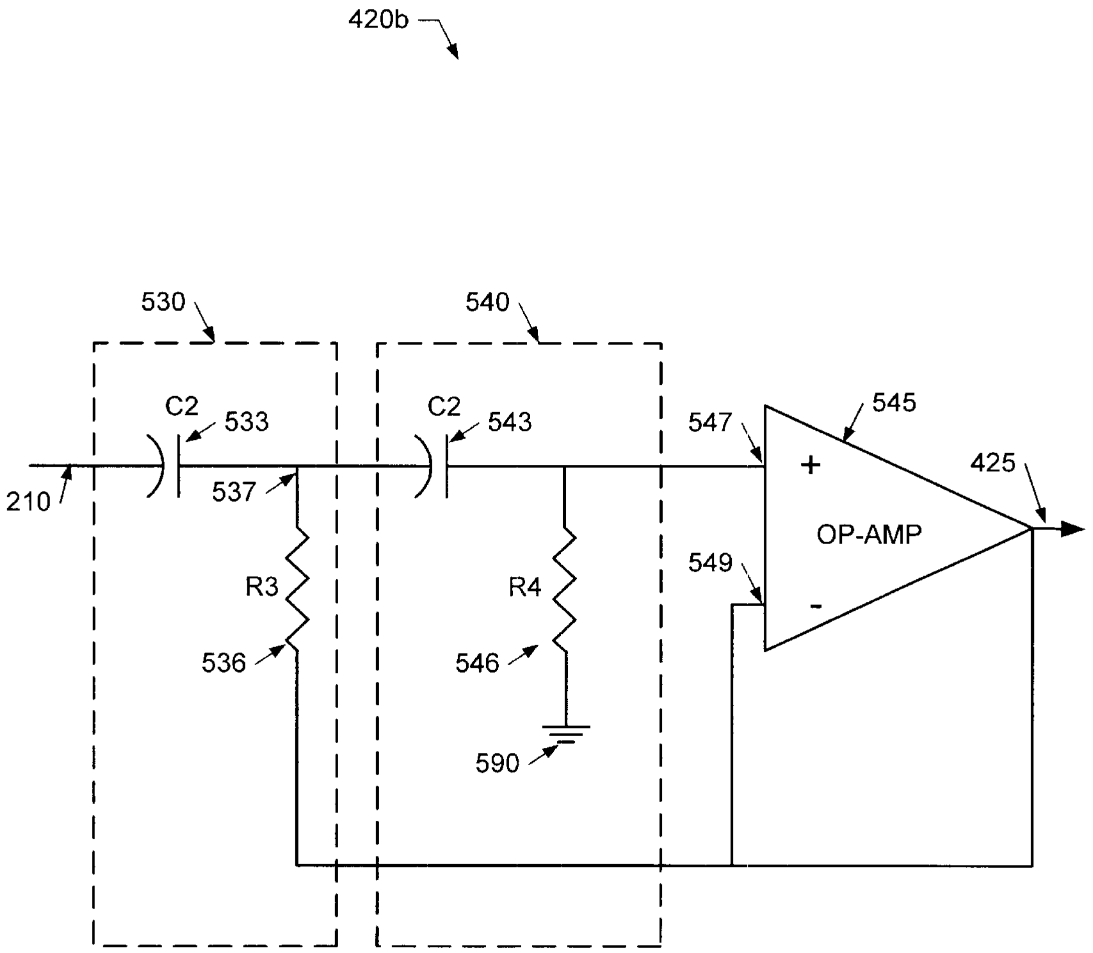
FIG. 5B is a circuit diagram showing the high-pass filter of FIG. 4B in more detail.

FIG. 5B shows a $2^{nd}$-order high-pass filter 420*b* that may be used to produce the equivalent main-speaker response 425 (FIG. 4B) of FIG. 4B. The example $2^{nd}$-order high-pass filter 420*b* comprises two RC circuits 530, 540 serially connected to the input of the operational amplifier 545 to produce the desired $2^{nd}$-order characteristics. If identical capacitors 533, 543 are used in each of the RC circuits 530, 540, and the capacitor value and resistor values are $C_2$, $R_3$, and $R_4$, respectively, then the characteristic frequency, $F_{sp}$. and the damping factor, $Q_{sp}$, are given by Eq. 4 and Eq. 5, respectively, as:

$$F_{sp} = \frac{1}{2\pi C_2 \sqrt{R_3 R_4}} \text{ and} \qquad \text{[Eq. 4]}$$

$$Q_{sp} = \frac{\sqrt{\frac{R_4}{R_3}}}{2} \qquad \text{[Eq. 5].}$$

Thus, the values of $R_3$ (536 of FIG. 5B) and $R_4$ (546 of FIG. 5B) in terms of $F_{sp}$ and $Q_{sp}$ would be:

$$R_3 = \frac{1}{4\pi C_2 Q_{sp} F_{sp}} \text{ and} \qquad \text{[Eq. 6]}$$

$$R_4 = \frac{Q_{sp}}{C_2 \pi F_{sp}} \qquad \text{[Eq. 7].}$$

Figure 5C:
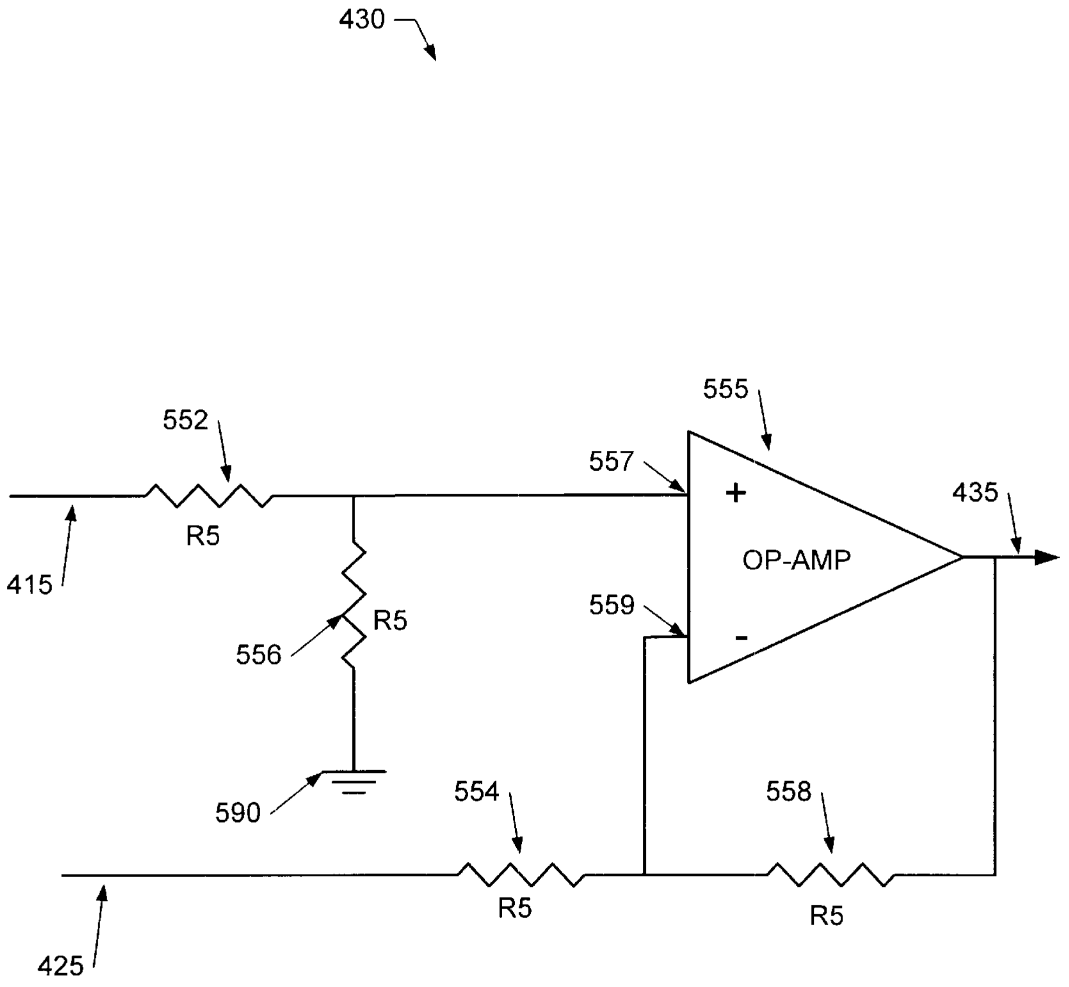
FIG. 5C is a circuit diagram showing the summing circuit of FIG. 4B in more detail.

FIG. 5C shows a summing circuit 430 that may be used to subtract the equivalent main-speaker signal 425 from the desired system signal 415. The summing circuit 430 comprises an operational amplifier 555 configured as an adder circuit with four fixed resistors 552, 554, 556, 558. Since adder circuits are well known in the art, details of adder circuits will not be further discussed.

A convenient way to achieve adjustable values of $R_1$ (522 of FIG. 5A), $R_3$ (536 of FIG. 5B), and $R_4$ (546 of FIG. 5B) is to realize them with voltage controlled equivalent resistances. This is shown in FIGS. 6A, 6B, 6C, and 6D.

Figure 6A:
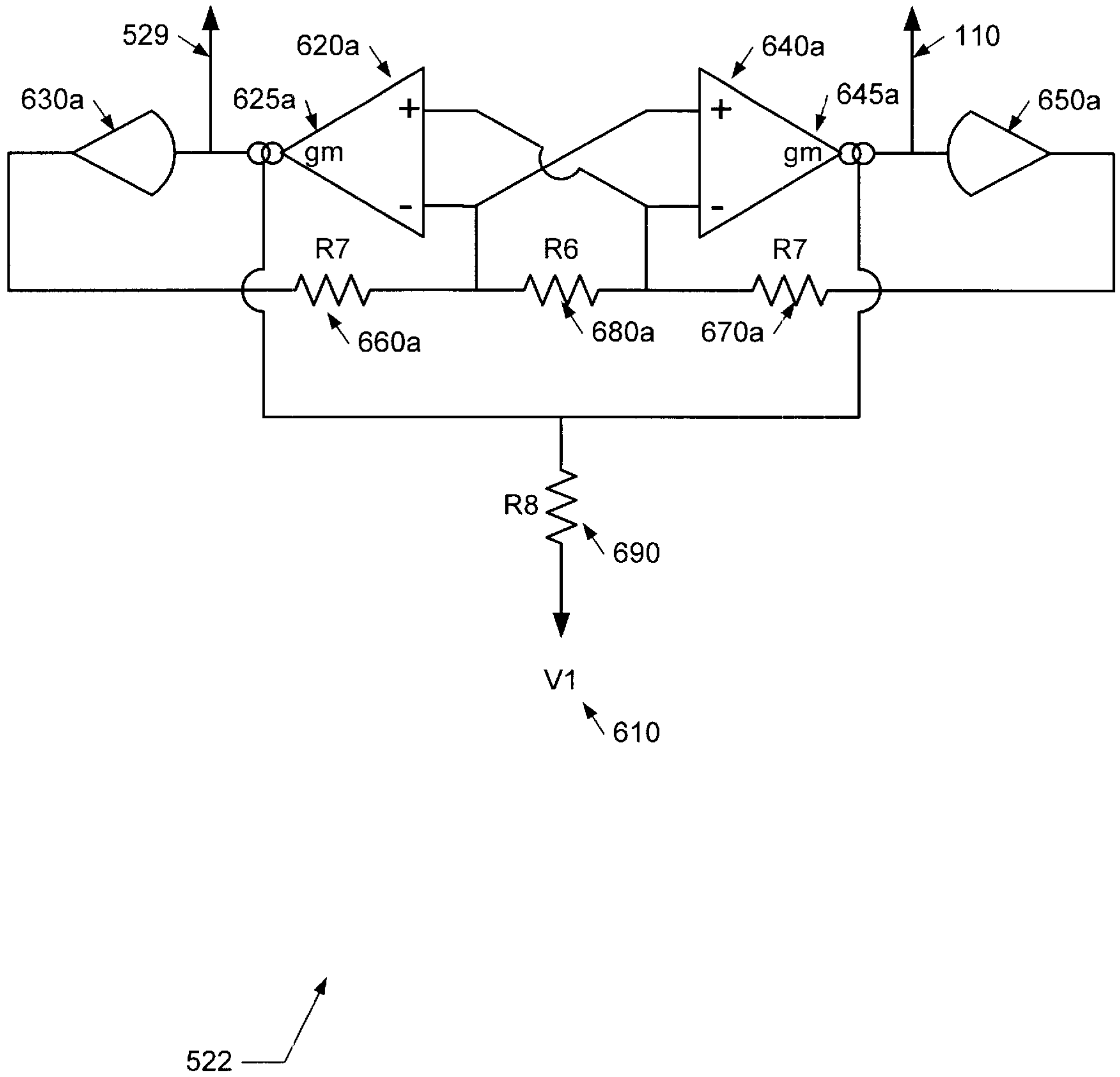
FIG. 6A is a circuit diagram showing an equivalent-resistance circuit that can be used for the first resistor (R1) in FIG. 5A.
Figure 6B:
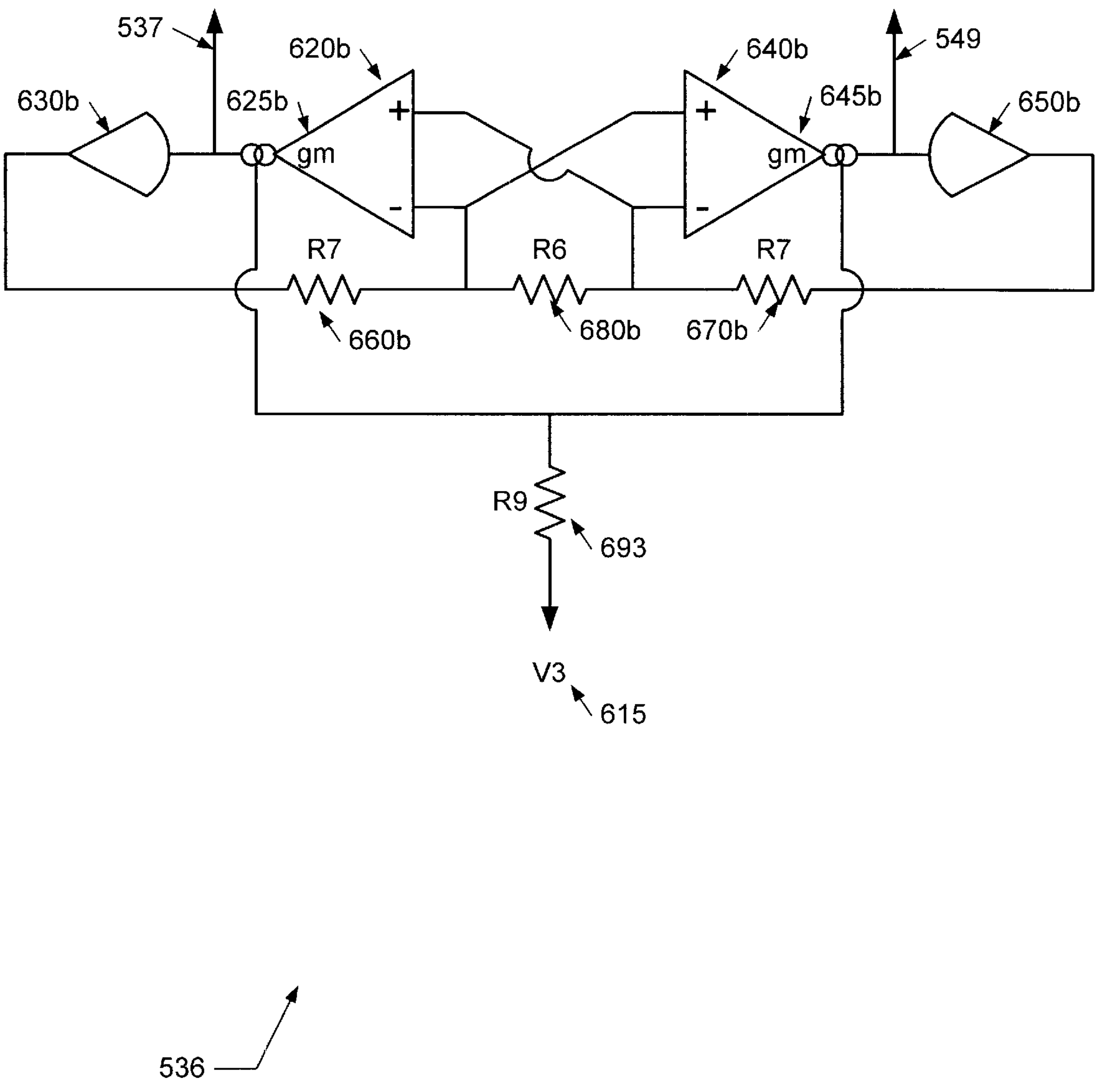
FIG. 6B is a circuit diagram showing an equivalent-resistance circuit that can be used for the third resistor (R3) in FIG. 5B.
Figure 6C:
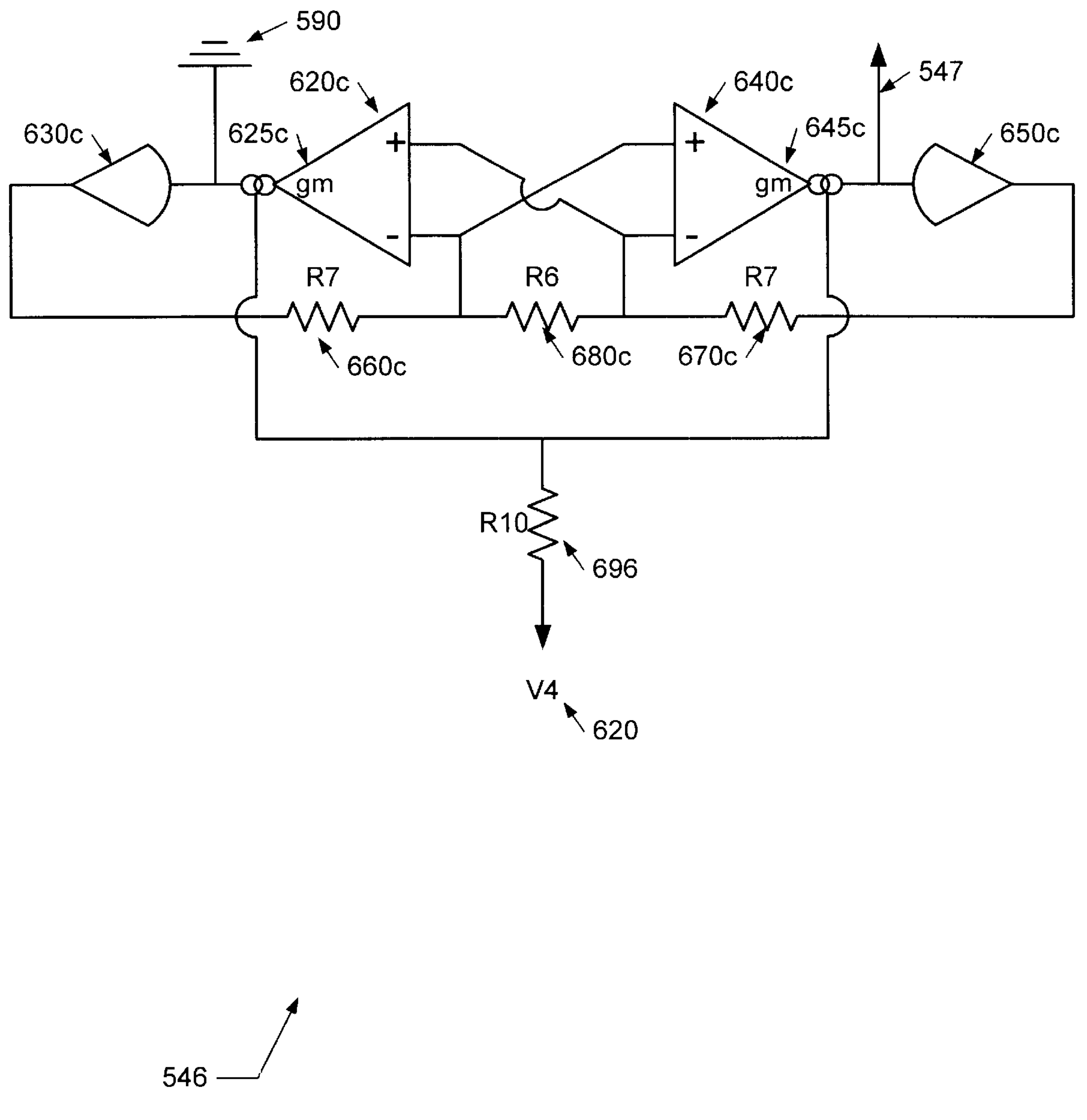
FIG. 6C is a circuit diagram showing an equivalent-resistance circuit that can be used for the fourth resistor (R) in FIG. 5B.

FIGS. 6A, 6B, and 6C show the resistors $R_1$ (522 of FIG. 5A), $R_3$ (536 of FIG. 5B), and $R_4$ (546 of FIG. 5B) as voltage-controlled equivalent resistances, each implemented with two operational transconductance amplifiers 620*a*, 640*a*, 620*b*, 640*b*, 620*c*, 640*c*. Details on the operation of transconductance amplifiers are well known and understood by persons skilled in the art, and need not be described herein. Given the circuit configurations of FIGS. 6A, 6B, and 6C, the resistances $R_1$, $R_3$ and $R_4$ are represented by:

$$R_1 = \frac{2R_7R_8}{gmR_6V_1} \quad \text{[Eq. 8]},$$

$$R_3 = \frac{2R_7R_9}{gmR_6V_3} \text{ and} \quad \text{[Eq. 9]},$$

$$R_4 = \frac{2R_7R_{10}}{gmR_6V_4} \quad \text{[Eq. 10]},$$

where $V_1$, $V_3$, and $V_4$ are the control voltages and gm is the transconductance per current through the resistors $R_8$ (690 of FIG. 6A), $R_9$ (693 of FIG. 6B) and $R_{10}$ (696 of FIG. 6B). Thus, the required voltages $V_1$, $V_3$, and $V_4$, in terms of $F_{sp}$ and $Q_{sp}$, would be:

$$V_1 = \frac{2R_7R_8\pi C_1F_{sp}}{(gm)R_6Q_{sp}} \quad \text{[Eq. 11]},$$

$$V_3 = \frac{8R_7R_9\pi C_2F_{sp}Q_{sp}}{(gm)R_6} \text{ and} \quad \text{[Eq. 12]},$$

$$V_4 = \frac{2R_7R_{10}\pi C_2F_{sp}}{(gm)R_6Q_{sp}} \quad \text{[Eq. 13]}.$$

Figure 6D:
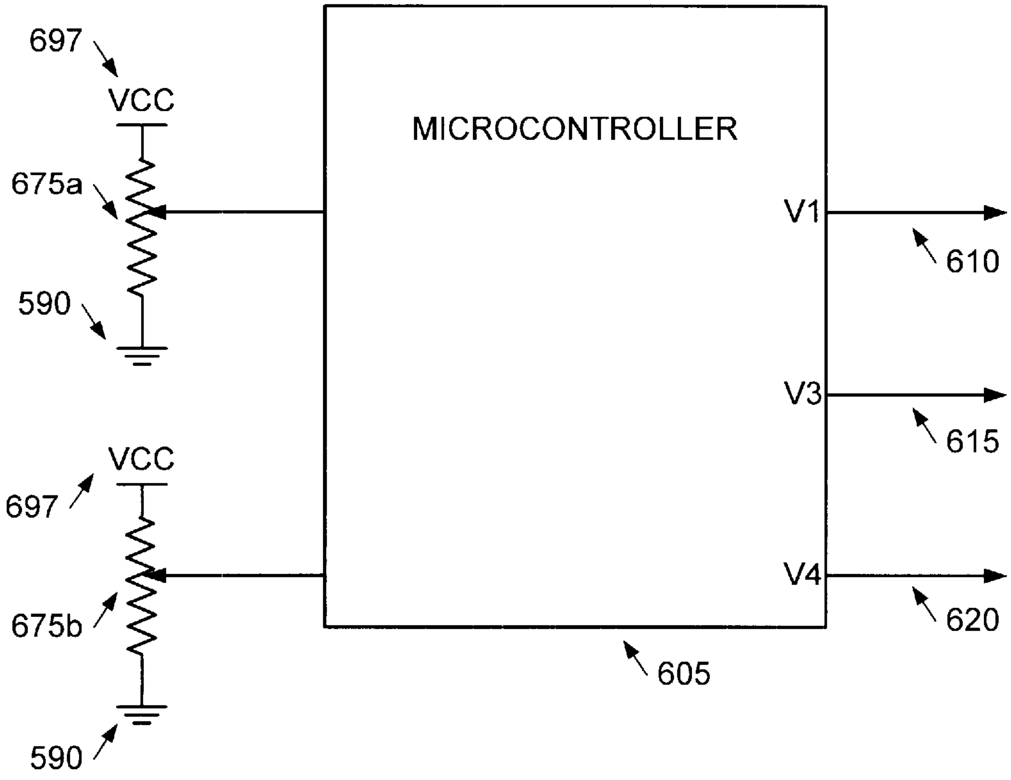
FIG. 6D is a block diagram showing a microcontroller circuit for providing a control voltage to the equivalent resistances of FIGS. 6A, 6B, and 6C.

FIG. 6D shows a microcontroller 605 that may be used in conjunction with the equivalent resistance circuits of FIG. 6A, 6B, and 6C. In practice, it is convenient to use a microcontroller 605 to perform the calculations so that user-adjustable controls for $F_{sp}$ and $Q_{sp}$ can supply voltages to the micro-controller 605, and the microcontroller 605 will supply outputs $V_1$ 610, $V_3$ 615, and $V_4$ 620 according to Eqs. 11, 12, and 13, respectively. Since the structure and operation of microcontrollers are well known in the art, these devices will not be discussed further. It is sufficient to say that careful adjustment of voltages $V_1$ (610 of FIGS. 6A and 6D), $V_3$ (615 of FIGS. 6B and 6D) and $V_4$ (620 of FIGS. 6C and 6D) produces the desired resistances $R_1$ (522 of FIG. 5A), $R_3$ (536 of FIG. 5B), and $R_4$ (546 of FIG. 5B), which, in turn, are used to construct the $2^{nd}$-order all-pass filter 410*b* (FIG. 4B) and the $2^{nd}$-order high-pass filter 420*b* (FIG. 4B) used in the production of the desired low-frequency signal 230.

As shown from the above embodiment of the invention, the user inputs indicative of the main speaker characteristics may be translated to adjustable voltages $V_1$, $V_3$, and $V_4$, which determine the variable resistances in the above-described circuits. These voltages are subsequently used to produce a desired all-pass response circuit, which has, as an output, the desired characteristics of the combined signal. Furthermore, these adjustable voltages are used to produce the equivalent main-speaker response circuit, which produces a main-speaker equivalent output. The desired low-frequency output is produced as a function of the main-speaker low-frequency characteristics and, therefore, will produce a better blending of sound when finally combined with the main-speaker sonic output.

Method Steps for Producing the Desired Low-Frequency Signal

Figure 7A:
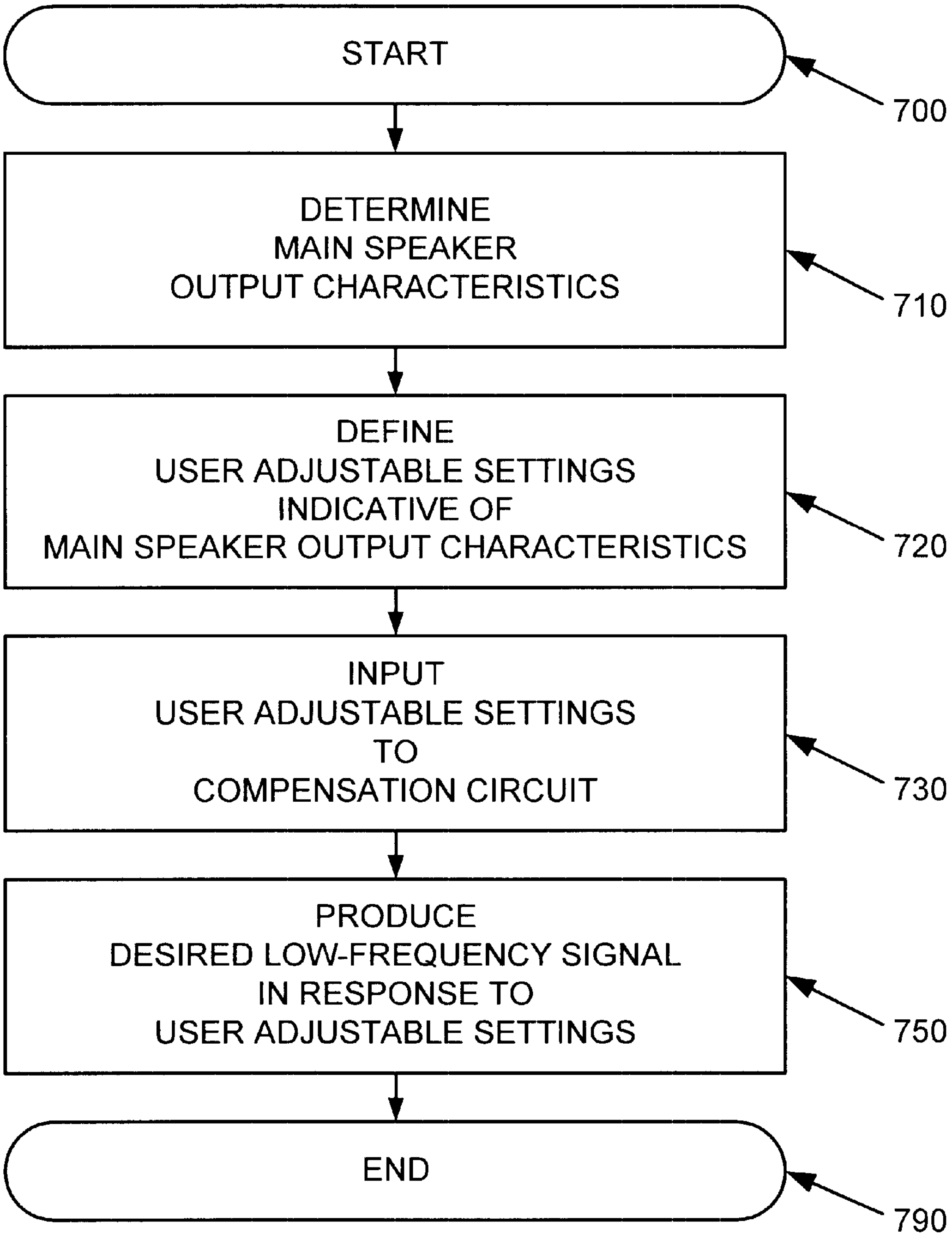
FIG. 7A is a flow chart showing the operation of the compensation circuit of FIG. 4A.

FIG. 7A shows the operation of the above-described embodiment of the invention. As an initial matter, the main speaker output characteristics are determined in step 710. User-adjustable settings, which are indicative of main speaker characteristics, are then defined in step 720. These user-adjustable settings may include, but are not limited to, the cutoff frequency of the main speaker, the damping factor of the main speaker, a sensitivity factor, an enclosure type (e.g., sealed or reflex), a gain factor, or any number of other factors as described above with reference to FIG. 3. Once these user-adjustable settings have been defined 720, these settings are input, in step 730, into the compensation circuit via a user interface similar to that described with reference to FIG. 3. The compensation circuit then produces, in step 750, the desired low-frequency signal in response to the user-adjustable settings, which are indicative of main-speaker low-frequency characteristics. This method, unlike conventional methods of adjusting a subwoofer response, takes into consideration the main-speaker low-frequency characteristics in determining the output of the subwoofer. Thus, this method results in a better blending of sound from the subwoofer-main speaker combination.

Figure 7B:
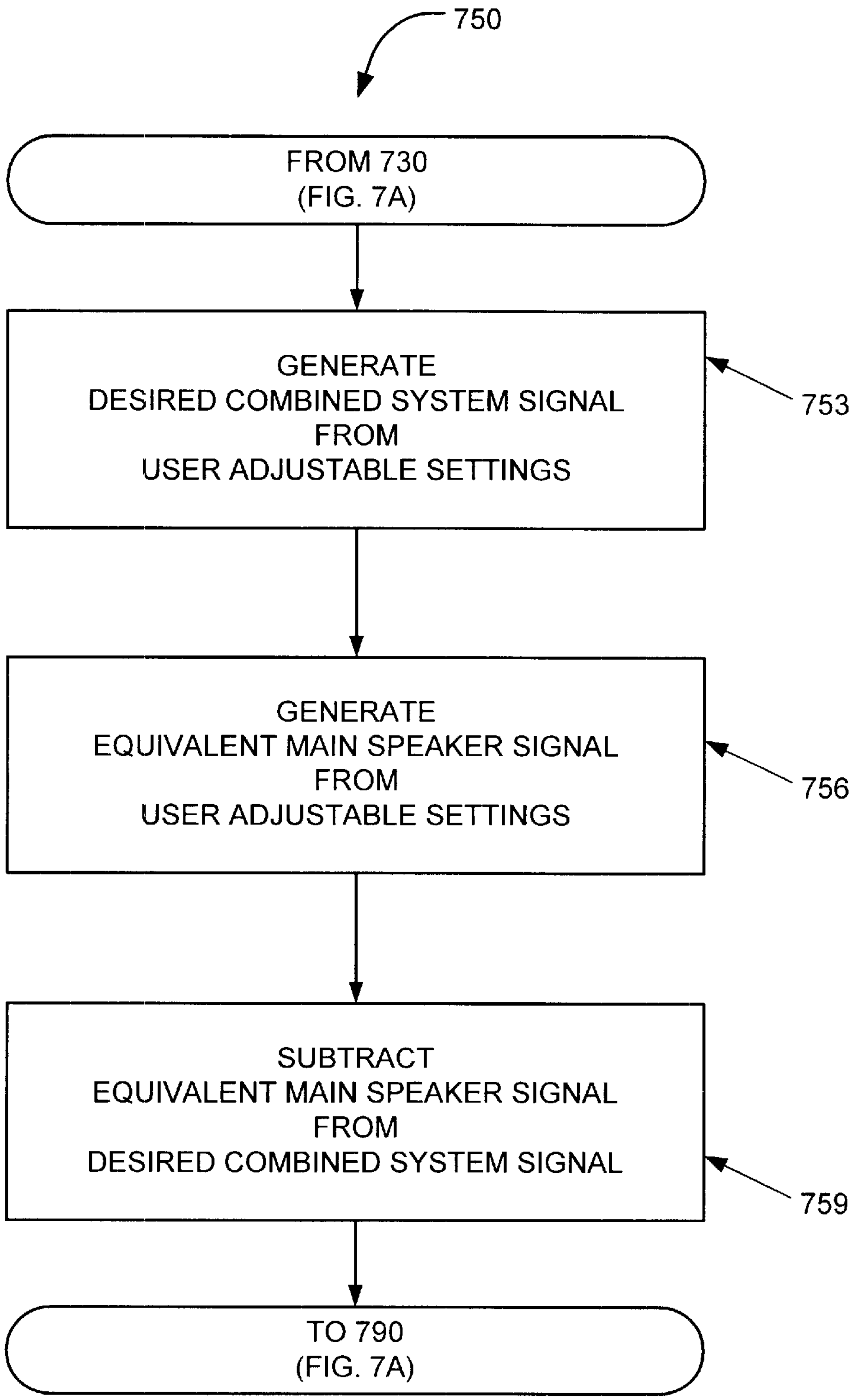
FIG. 7B is a flow chart showing the production of the low-frequency signal of FIG. 7A in more detail.

FIG. 7B shows the step of producing 750 (FIG. 7A) the desired low-frequency signal in more detail. Once the user-adjustable settings that are indicative of main-speaker low-frequency characteristics have been input 730 (FIG. 7A) into the compensation circuit via the user interface, the compensation circuit 400*a* (FIG. 4A) generates, in step 753, a desired combined system signal (which reflects the desired output 415 (FIG. 4A) from a subwoofer-main speaker combination) from the user-adjustable settings. The compensation circuit 400*a* (FIG. 4A) further generates, in step 756, an equivalent main-speaker signal 425 (FIG. 4A) from the user adjustable settings. Once these two signals have been generated 753, 756, the compensation circuit subtracts, in step 759, the equivalent main speaker signal 425 (FIG. 4A) from the desired system signal 415 (FIG. 4A). This subtracted signal 430 (FIG. 4A) may be directly used as the desired low-frequency signal 230 (FIG. 4A) or, alternatively, may be adjusted using a gain adjusting circuit 440 (FIG. 4A) prior to being used as the desired low-frequency signal. In either case, the step of subtracting 759 produces a low-frequency signal having the desired characteristics which will produce the appropriate low-frequency sonic output which will in turn, when combined with the main-speaker sonic output, produce the desired combined sonic output (i.e., the desired blending of sound).

Although an exemplary embodiment of the present invention has been shown and described, it will be apparent to those of ordinary skill in the art that a number of changes, modifications, or alterations to the invention as described may be made, none of which depart from the spirit of the present invention. For example, the compensation mechanism, although described as an analog circuit, may be implemented by digital means, the order of the filters may be adjusted depending on the response of the actual system components, the method steps may be rearranged, etc. All such changes, modifications, and alterations should therefore be seen as within the scope of the present invention.

I claim:

1. A system for adjusting the frequency response of subwoofer systems comprising:

a user interface configured to receive user-adjustable variables indicative of main speaker characteristics; and a compensation circuit configured to produce a desired low-frequency signal from an input signal in response to the user-adjustable variables, the compensation circuit comprising:

a desired transfer function circuit having frequency response characteristics analogous to a desired subwoofer-main speaker combination, the desired transfer function circuit configured to produce a desired combined subwoofer-main speaker signal;

an equivalent circuit having frequency response characteristics analogous to a main speaker, the equivalent circuit configured to produce a signal analogous to a main speaker signal; and a subtraction circuit configured to subtract the main speaker signal from the desired combined subwoofer-main speaker signal.

2. The system of claim 1, wherein the main speaker characteristics comprise low-frequency characteristics of the main speaker.

3. The system of 1, wherein the user adjustable variables comprise a low-frequency cutoff frequency.

4. The system of 1, wherein the user adjustable variables comprise a low-frequency damping factor.

5. The system of 1, wherein the user adjustable variables comprise a speaker sensitivity factor.

6. The system of 1, wherein the user adjustable variables comprise an enclosure type.

7. The system of 1, wherein the user adjustable variables comprise a gain factor.

8. A method for adjusting the frequency response of subwoofer systems, comprising the steps of:

inputting user adjustable settings indicative of main speaker characteristics; and producing a desired low-frequency signal in response to the user adjustable settings, the step of producing the desired low-frequency signal comprising the steps of:

generating a desired combined system signal from the user adjustable settings, the desired system signal having frequency response characteristics of a desired combined subwoofer-main speaker system;

generating an equivalent main speaker signal from the user adjustable settings, the equivalent main speaker signal having frequency response characteristics analogous to that of the main speaker; and subtracting the equivalent main speaker signal from the desired combined system.

9. The method of claim 8, wherein main speaker characteristics comprise low-frequency characteristics of the main speaker.

10. The method of claim 8, wherein the main speaker characteristics comprise a low-frequency cutoff frequency.

11. The method of claim 8, wherein the main speaker characteristics low-frequency damping factor.

12. The method of claim 8, wherein the main speaker characteristics speaker sensitivity factor.

13. The method of claim 8, wherein the main speaker characteristics enclosure type.

14. The method of claim 8, wherein the main speaker characteristics gain factor.

15. A system for adjusting the frequency response of subwoofer systems, comprising:

means for inputting a plurality of user adjustable setting indicative of main-speaker characteristics;

means for receiving an input signal;

means for generating a desired combined system signal from the user adjustable settings, the desired system signal having frequency response characteristics of a desired combined subwoofer-main speaker system;

means for generating an equivalent main speaker signal from the user adjustable settings, the equivalent main speaker signal having frequency response characteristics analogous to that of the main speaker; and means for subtracting the equivalent main speaker signal from the desired combined system signal.

16. The system of claim 15, wherein the main speaker characteristics comprise low-frequency characteristics of the main speaker.

17. The system of claim 15, wherein the means for producing the desired low-frequency signal further comprises means for setting a low-frequency cutoff-frequency of the main speaker.

18. The system of claim 15, wherein the means for producing the desired low-frequency signal further comprises means for setting a low-frequency damping factor of the main speaker.

19. The system of claim 15, wherein the means for producing the desired low-frequency signal further comprises means for setting a gain of the main speaker.

* * * * *